United States Patent [19]
Evans, Jr. et al.

[11] Patent Number: 5,614,438
[45] Date of Patent: Mar. 25, 1997

[54] METHOD FOR MAKING LSCO STACK ELECTRODE

[75] Inventors: Joseph T. Evans, Jr.; Leonard Boyer, both of Albuquerque, N.M.

[73] Assignee: Radiant Technologies, Inc., Albuquerque, N.M.

[21] Appl. No.: 405,216

[22] Filed: Mar. 15, 1995

[51] Int. Cl.$^6$ ................................. H01L 21/44
[52] U.S. Cl. ................ 437/192; 437/190; 437/47; 437/60; 437/919; 148/DIG. 14; 148/DIG. 100
[58] Field of Search ................ 437/190, 201, 437/203, 192, 47, 60, 919; 148/DIG. 14, DIG. 100

[56] References Cited

U.S. PATENT DOCUMENTS

| | | | |
|---|---|---|---|
| 5,242,534 | 9/1993 | Bullington et al. | 437/203 |
| 5,372,859 | 12/1994 | Thakoor | 427/551 |
| 5,440,173 | 8/1995 | Evans, Jr. et al. | 437/190 |
| 5,479,317 | 12/1995 | Ramesh | 361/321.5 |

FOREIGN PATENT DOCUMENTS 259472  10/1993  Japan ........................... 437/201

Primary Examiner—Tuan H. Nguyen
Attorney, Agent, or Firm—Calvin B. Ward

[57] ABSTRACT

A method for making an improved LSCO stack in the generation of platinum features on the surface of a substrate. The method provides an inexpensive means for depositing and etching LSCO material in the construction of small platinum features. The method comprises sputtering of the LSCO material and utilizing a photoresist mask to pattern the LSCO in accordance with the platinum features. The problems and expense associated with high-temperature deposition of LSCO on platinum and the etching thereof are overcome by sputtering the LSCO at room temperature.

4 Claims, 3 Drawing Sheets

METHOD FOR MAKING LSCO STACK ELECTRODE

FIELD OF THE INVENTION

The present invention relates to integrated circuit devices, and more particularly, to an improved method for constructing small electrodes for use with ferroelectric based capacitors and the like.

BACKGROUND OF THE INVENTION

Ferroelectric based capacitors are in increasing demand as integrated circuit elements. Capacitors having lead lanthanum titanium zirconate (PLZT) dielectrics offer large dielectric constants which in turn make the construction of small capacitors with relatively large capacitances possible. A ferroelectric capacitor consists of a PLZT layer sandwiched between two planar electrodes. Capacitors utilizing platinum electrodes are particularly advantageous, since Pt electrodes can withstand the high processing temperatures inherent in PLZT based capacitor fabrication while providing an electrode structure having high conductivity.

The interaction of the platinum electrode with the PLZT produces a Schottky diode at the interface of the PLZT and platinum electrode. In applications in which information is stored in the ferroelectric by altering the polarization of the ferroelectric, the voltage difference that must be applied across the capacitor to switch the polarization is increased by the presence of this diode since the voltage drop needed to forward bias the diode is a significant fraction of the potential difference needed to switch the polarization of the ferroelectric.

The diode in question can be eliminated if an ohmic material is used as the electrode in contact with the PLZT. Unfortunately, such ohmic materials have relatively high resistivities, and hence, must be connected to a higher conductivity structure that provides the connection to the power source. One common method for constructing an ohmic contact with sufficient conductivity is to sandwich the ohmic material between a platinum electrode and the ferroelectric layer. Platinum is preferred for this purpose because it can withstand the high processing temperatures encountered in the subsequent fabrication steps. A particularly useful ohmic material is lanthanum strontium cobalt oxide (LSCO).

The bottom electrode of a PLZT capacitor is typically deposited on the semiconductor surface or a $SiO_2$ layer thereon. To "stick" the platinum layer to the silicon, a titanium layer is deposited on the silicon surface prior to depositing the platinum layer. The LSCO layer is then deposited in order to isolate the platinum electrode from the PLZT to prevent the formation of the diode junction described above. The LSCO is typically deposited by means of sputtering at high temperatures, typically 600° C., in order to properly crystalize the LSCO layer. A second layer of LSCO is then deposited after the PLZT material is deposited and annealed. Finally, this top LSCO layer is etched to form the top electrode of the capacitor.

Despite the benefits of the LSCO layer, there are disadvantages inherent in the above-described method of depositing LSCO and the etching thereof. High temperatures are necessary during the LSCO deposition process in order to adequately crystalize the LSCO on the platinum. At such high temperatures, the presence of oxygen around the titanium-platinum junction causes the titanium to oxidize, impeding crystalization of the LSCO layer. These conditions also cause the platinum layer to buckle or "grow hillocks." Consequently, when the LSCO layer is etched, there are thin spots between the platinum electrodes which can eventually lead to shorts between them.

Another disadvantage of prior art fabrication of the LSCO layer, is the need to use a very expensive ion beam etching method. There are no effective chemical etching processes that can be used to shape the LSCO layer. The high temperatures used during the deposition of the LSCO foreclose lift-off methods. Hence, the LSCO electrodes must be formed by ion beam etching of an LSCO layer.

Yet another disadvantage of prior art methods for fabricating the LSCO layer, is the likelihood of misalignment between the LSCO and platinum layers. This in turn leads to under-or oversizing the memory cell.

Accordingly, it is the general object of the present invention to provide a method for making an improved LSCO electrode stack.

It is a further object of the present invention to provide a method for making an LSCO layer which does not require the LSCO to be deposited at high temperatures.

It is also an object of the present invention to provide a method for making an LSCO layer which does not require ion beam etching.

Yet another object of the present invention is to provide a method for making an LSCO layer in which the LSCO and electrode layers are self-aligning.

These and other objects of the present invention will become apparent to those skilled in the art from the following detailed description of the invention and the accompanying drawings.

SUMMARY OF THE INVENTION

The problems associated with the deposition and etching of the LSCO layer in the generation of platinum features on the surface of a substrate are overcome in the present invention by utilizing low-temperature sputtering of the LSCO layer. More, specifically, in the method of the present invention, a layer of titanium is deposited on the substrate and then the titanium layer is masked in regions outside the region to be covered by the electrode by applying a layer of masking material. The exposed regions of the titanium layer are then etched. A new layer of titanium is then deposited followed by a layer of platinum. LSCO material is then sputtered onto the platinum layer at room temperature. The masking material is then removed leaving the platinum electrode bonded to the substrate by the newly deposited titanium layer. Finally, the resulting structure is crystallized by heating it to a high temperature.

DETAILED DESCRIPTION OF THE INVENTION

The present invention provides better bonding between the platinum electrode and the silicon substrate. In addition, the present invention eliminates the need to use expensive ion beam etching methods. The manner in which the present invention achieves these advantages may be more easily understood with reference to FIGS. 1–3 which illustrate the deposition of an LSCO stack electrode according to the method of the present invention.

Figure 1:
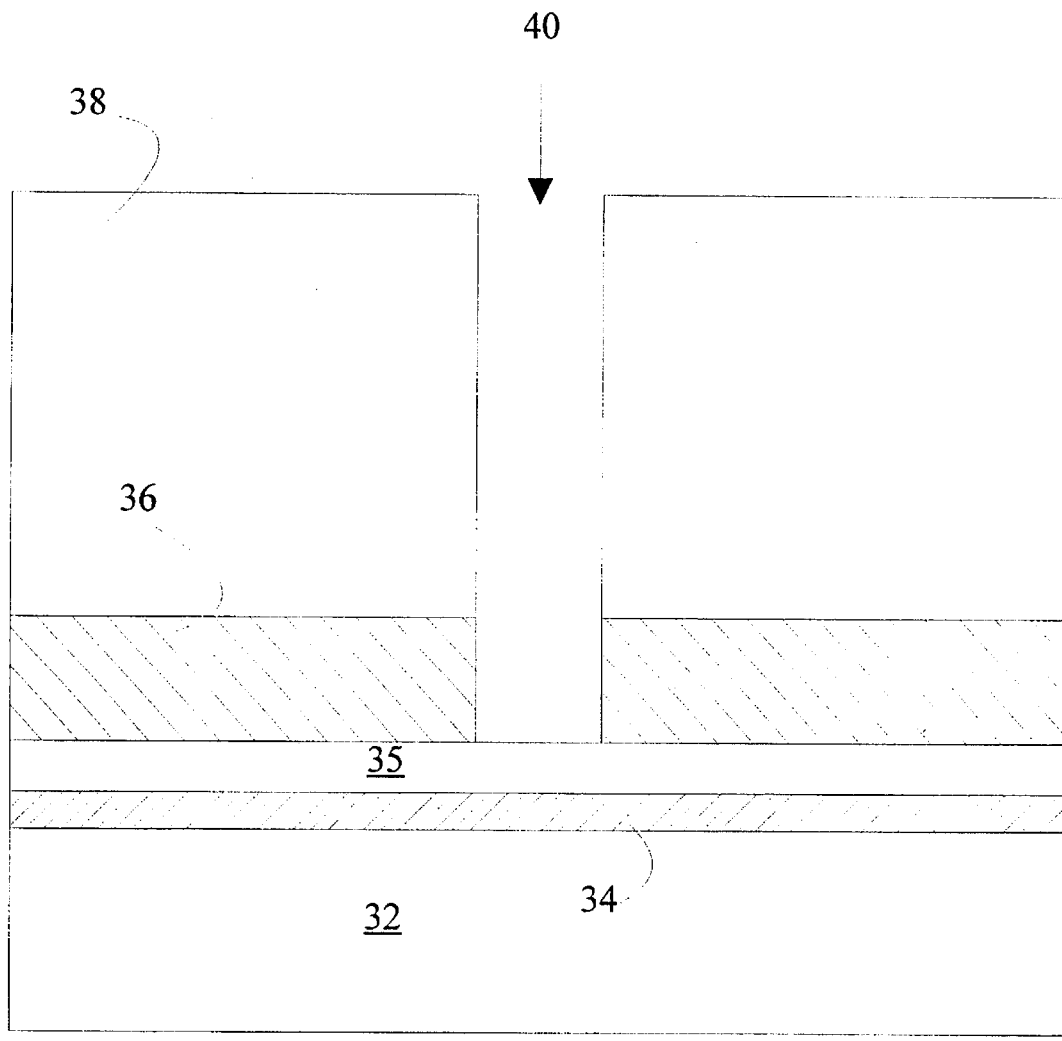
FIGS. 1, 2, 3, and 4 are cross-sectional views of an integrated circuit substrate at different stages in the deposition of an LSCO stack comprising a platinum electrode according to the method of the present invention.

The deposition process is begun, as shown in FIG. 1, by depositing an $SiO_2$ layer 34 on a silicon substrate 32. A titanium dioxide layer 35 is then deposited on the $SiO_2$ layer. The TiO2 layer provides two benefits. First, as will be explained in more detail below, layer 35 acts as an etch stop for defining the end-point of a subsequent etching process. Second, layer 35 prevents contact between materials connected to the stack electrode and the underlying $Si\ O_2$. Such contact can cause component failure in the case of PZT dielectric layers that are deposited on top of the finished electrode.

A titanium layer 36 having a thickness of approximately 1000 Å is then deposited on $TiO_2$ layer 35 and a patterned layer 38 of photoresist is deposited on titanium layer 36. The titanium layer is then preferably dry etched using a $CF_4$ plasma. Other etching methods known in the art may also be used. For example, a wet etching solution of water, HCl, and buffered oxide etchant in the ratios of 3:1:1 is also suitable for the present invention. The buffered oxide etchant is a dilute HF solution which is commercially available and common in the art. The etching is sufficient to remove the titanium layer in areas that are not protected by the photoresist layer. An exemplary such location is shown at 40. The etching is preferably stopped by the $Ti\ O_2$ layer 35 discussed above.

The etching operation provides two benefits. First, it removes any residue generated by the deposition of the photoresist. Second, the subsequently deposited electrode layers are counter sunk into layer 36. As will be explained in more detail below, this counter sinking operation thereby reduces the height of the finished electrode.

Figure 2:
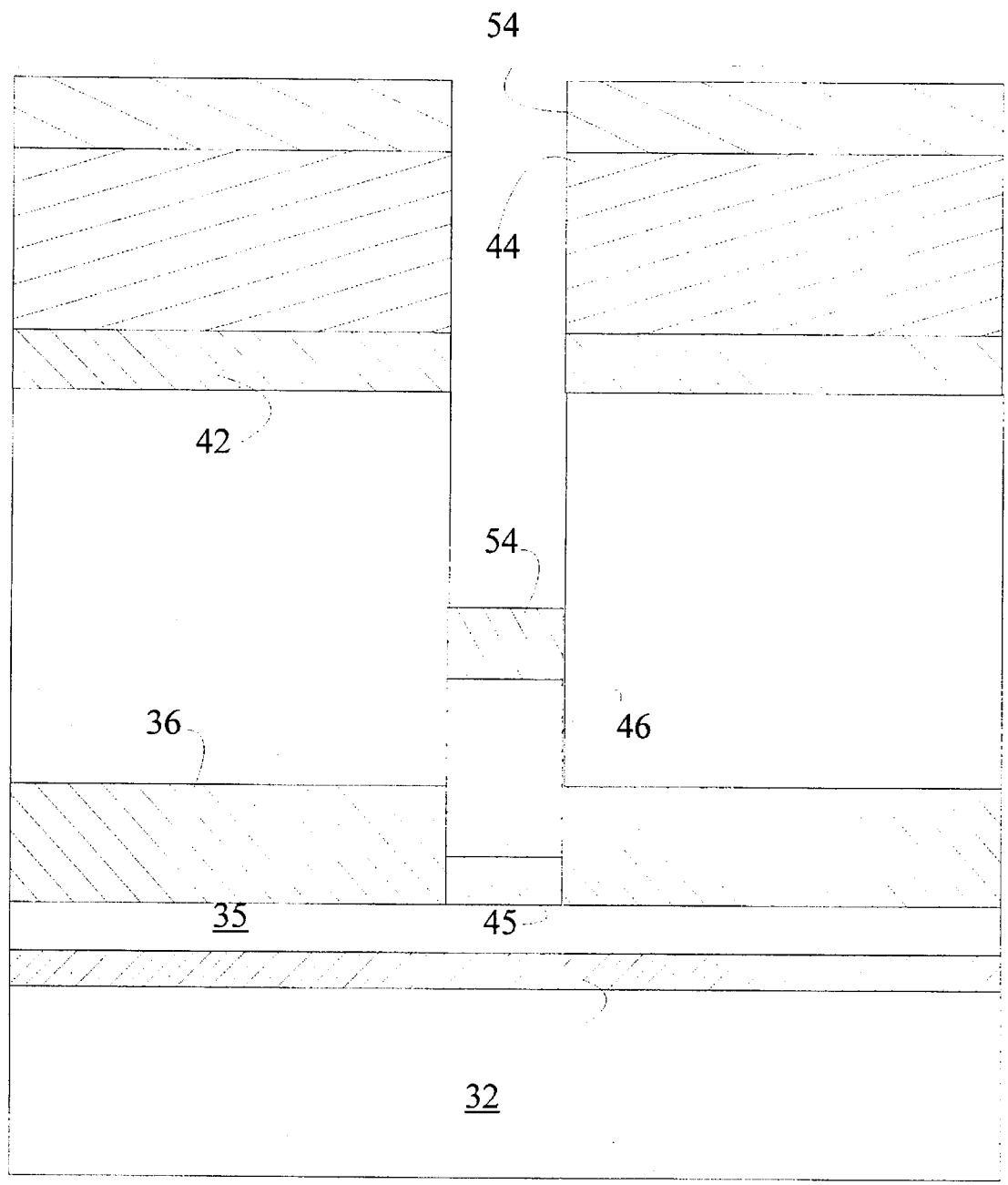
Figure 4:
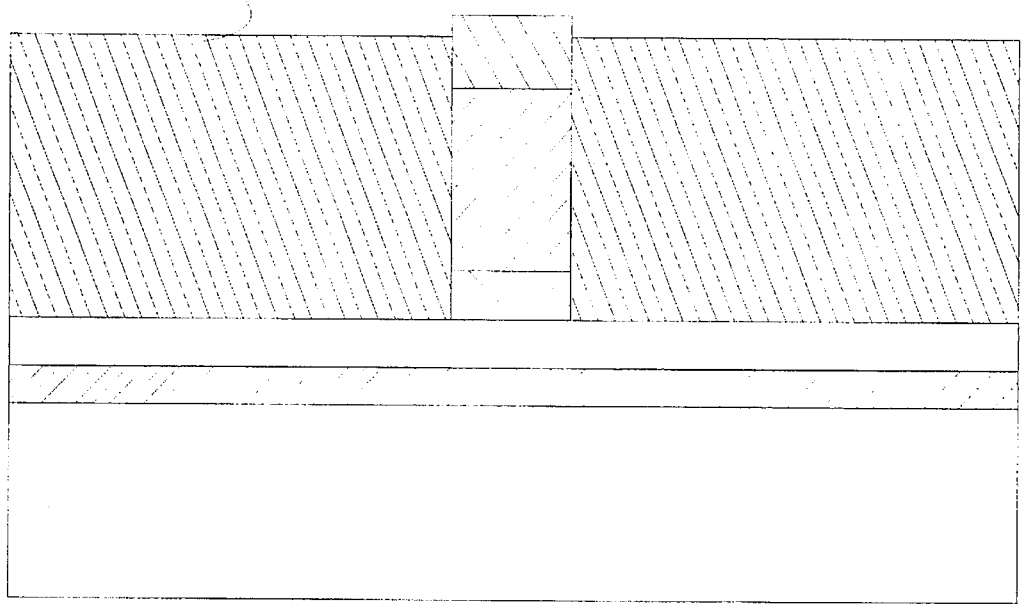

Referring to FIG. 2, after the etching operation is completed, an approximately 200 Å layer 42 of titanium is deposited. This generates a titanium base layer 45 which will "glue" the subsequently deposited platinum to the $TiO_2$ layer. As noted above, the etching operation has removed any residue resulting from the photoresist deposition; hence, the titanium is firmly bound to the $TiO_2$ surface. The "glue" layer is not limited to titanium. Any material that will bond the platinum to the substrate with sufficient force to resist separation of the platinum from the substrate during subsequent processing steps may be utilized, provided the material may be etched. For example, gold is also found to act as a sufficient glue material for purposes of the present invention.

Next, an approximately 1500 Å layer 44 of platinum is deposited. This layer will generate the platinum electrode 46 that underlies the LSCO electrode in those regions that are not protected by the photoresist. A 600 A layer 54 of LSCO is then sputtered on top of platinum layer 44 at room temperature. This layer provides the LSCO layer 56 in the final electrode.

Figure 3:
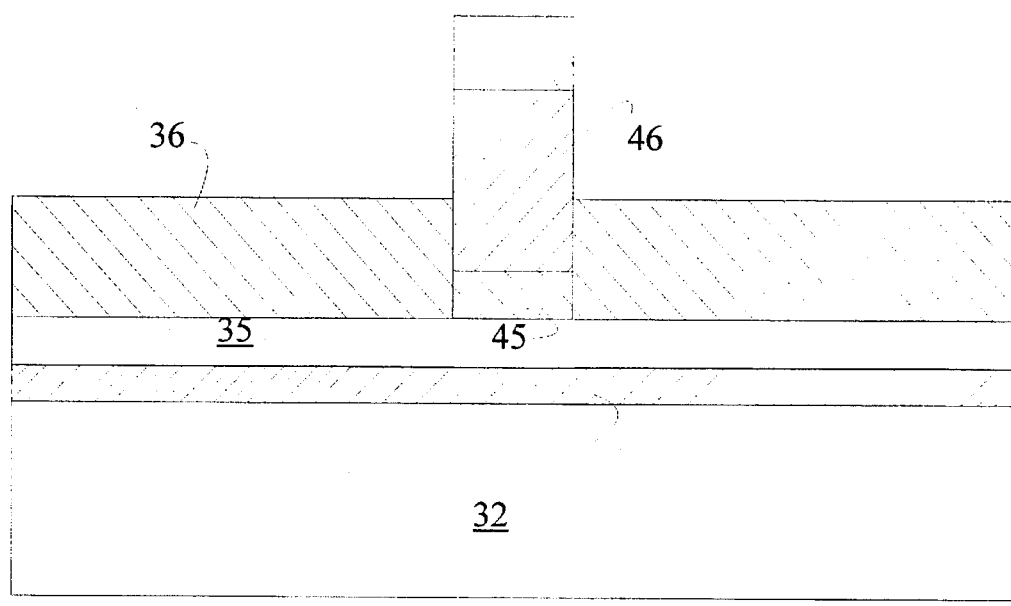

Next, the photoresist is removed leaving the electrode stack in its final configuration as shown in FIG. 3. The LSCO, however, has not yet been crystallized since it was deposited at room temperature. In addition, the metallic titanium layer must be converted to an insulator, i.e., $Ti\ O_2$. These two operations are accomplished by sintering the electrode stack structure a temperature of 650° C. in order to crystalize the LSCO layer. After the sintering operation, the electrode structure is heated in the presence of oxygen to convert the metallic titanium layer 36 to a $Ti\ O_2$ layer 60.

It should be noted that the oxidation of the metallic titanium layer causes that layer to expand by a factor of approximately two. Hence, when the oxidation is complete, the electrode stack is nearly flush with the top surface of $TiO_2$ layer 60. It will be apparent to those skilled in the art from the above discussion that by adjusting the initial thickness of the metallic titanium layer, the degree of protrusion of the electrode stack above the $TiO_2$ layer may be adjusted to any desired level.

By sputtering the LSCO at room temperature rather than at the very high temperatures used in the prior art, a photoresist mask could be used to pattern the LSCO layer, thereby eliminating the need to use a very expensive ion beam etching method. In addition, by lifting the LSCO and platinum layers simultaneously, the LSCO and platinum layers are self-aligned, eliminating the risk of misalignment.

A further and unexpected benefit of this mode of fabrication is the improved stability of the platinum layer. In prior art LSCO deposition methods, the platinum to silicon bond is unreliable. The failure is believed to be the result of the thermal stress inherent in the high deposition temperatures needed to crystalize the LSCO layer during deposition thereof. In the present invention, it is found that the presence of the LSCO layer on the platinum prior to heating the LSCO passivates the platinum from oxygen during the LSCO heating. This stabilizes the platinum layer leading to lower rates of failure rates and a high-quality electrode.

While the present invention has been described in terms of the manufacture of ferroelectric capacitors, it will be apparent to those skilled in the art that the method may be utilized in other contexts in which LSCO stacks are employed in the generation of small metallic features. Similarly, the present invention has been described with reference to specific thickness of electrodes and specific etchants; however, it will be apparent to those skilled in the art that the present invention will operate satisfactorily with other values for these parameters. Accordingly, the present invention is to be limited solely by the scope of the following claims.

What is claimed is:

1. A method for depositing an electrode in a region of a substrate, said method comprising the steps of:

depositing a first layer of a glue material on said substrate, said glue material being a material capable of bonding platinum to said substrate;

masking said first layer in regions outside of said region by applying a layer of masking material on said regions;

applying an etchant to said masked substrate, said etchant etching said first layer in regions not protected by said masking material;

depositing a second layer of said glue material in said region;

depositing a platinum layer in said region;

depositing an amorphous ohmic contact material in said region;

removing said masking material; and heating said ohmic contact material to a temperature sufficient to crystallize said ohmic contact material.

2. The method of claim 1 wherein said step of depositing an ohmic contact material comprises sputtering said ohmic contact material at room temperature.

3. The method of claim 2 wherein said ohmic material is LSCO.

4. The method of claim 1 wherein said substrate is $TiO_2$ and said glue material is titanium.

* * * * *